(12) United States Patent
Kwack et al.

(10) Patent No.: US 8,378,355 B2
(45) Date of Patent: Feb. 19, 2013

(54) THIN FILM TRANSISTOR ARRAY SUBSTRATE AND METHOD FOR FABRICATING THE SAME

(75) Inventors: Hee Young Kwack, Gyeonggi-do (KR); Heung Lyul Cho, Gyeonggi-do (KR); Jeong Yun Lee, Seoul (KR); Jung Ho Son, Busan (KR)

(73) Assignee: LG Display Co., Ltd., Seoul (KR)

( * ) Notice: Subject to any disclaimer, the term of this patent is extended or adjusted under 35 U.S.C. 154(b) by 100 days.

(21) Appl. No.: 12/966,048

(22) Filed: Dec. 13, 2010

(65) Prior Publication Data

US 2011/0156040 A1 Jun. 30, 2011

(30) Foreign Application Priority Data

Dec. 30, 2009 (KR) .................. 10-2009-0133879
Apr. 22, 2010 (KR) .................. 10-2010-0037605

(51) Int. Cl.
*H01L 29/04* (2006.01)

(52) U.S. Cl. .............. 257/72; 257/389; 257/59; 257/79; 438/398; 349/141; 349/155

(58) Field of Classification Search .............. 257/59, 257/72; 438/151
See application file for complete search history.

(56) References Cited

U.S. PATENT DOCUMENTS

| 5,445,986 | A | * | 8/1995 | Hirota | 438/398 |
|---|---|---|---|---|---|
| 5,886,762 | A | * | 3/1999 | Lee et al. | 349/141 |
| 6,933,528 | B2 | * | 8/2005 | Itakura et al. | 257/59 |
| 7,405,428 | B2 | * | 7/2008 | Yun | 257/72 |
| 2001/0019133 | A1 | * | 9/2001 | Konuma et al. | 257/79 |
| 2007/0153214 | A1 | * | 7/2007 | Park et al. | 349/155 |
| 2011/0156165 | A1 | * | 6/2011 | Jang et al. | 257/389 |

OTHER PUBLICATIONS

Riccardo d'Agostino, et. al., "Plasma etching of Si and SiO2 in SF06-02 mixtures," J. Appl. Phys. 52, 162 (1981).*

* cited by examiner

*Primary Examiner* — Matthew W Such
*Assistant Examiner* — Christopher Johnson
(74) *Attorney, Agent, or Firm* — Morgan, Lewis & Bockius LLP

(57) ABSTRACT

A thin film transistor array substrate including a substrate, a gate line intersecting a data line to define a pixel region on the substrate, a switching element disposed at an intersection of the gate line and the data line, a plurality of pixel electrodes and a plurality of first common electrodes alternately arranged in the pixel region, a second common electrode overlapping the data line and interposed between a gate insulation film and a protective film, a first storage electrode on the substrate, a second storage electrode overlapping the first storage electrode, and an organic insulation film on the switching element, the second storage electrode, the data line, a gate pad, and a data pad, wherein the second common electrode covers the data line, the protective film, the organic insulation film, and the gate insulation film, and has inclined surfaces connected to the surface of the substrate.

21 Claims, 13 Drawing Sheets

FIG. 12
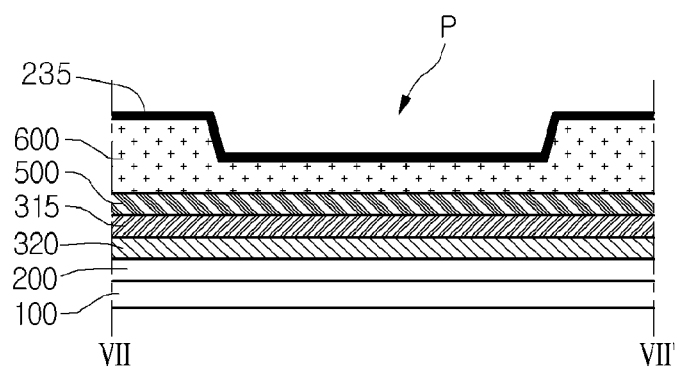
FIG. 13A
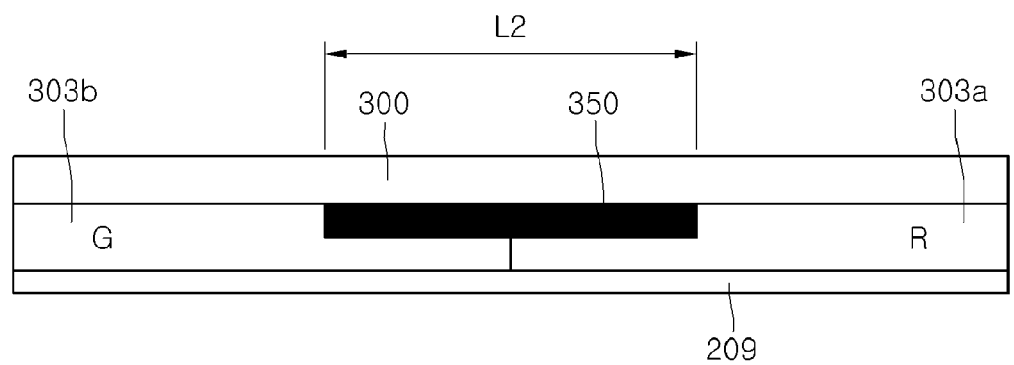
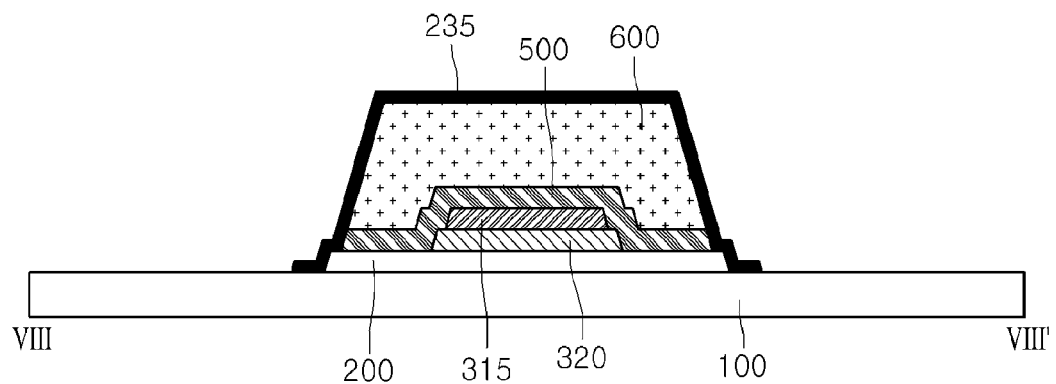

First Etch Process

Second Etch Process

THIN FILM TRANSISTOR ARRAY SUBSTRATE AND METHOD FOR FABRICATING THE SAME

This application claims the benefit of Korean Patent Application No. 10-2009-0133879, filed on Dec. 30, 2009, and Korean Patent Application No. 10-2010-0037605, filed on Apr. 22, 2010, which are hereby incorporated by reference.

BACKGROUND OF THE INVENTION

1. Field of the Invention

This application relates to a liquid crystal display (LCD) device, and more particularly to a thin film transistor array substrate and method for fabricating the same.

2. Discussion of the Related Art

In general, the light transmittance of a liquid crystal with a dielectric anisotropy in LCD devices is controlled by an electric field in order to display an image. The LCD devices are usually fabricated by combining a color filter array substrate and a thin film transistor array substrate with a liquid crystal layer disposed between the two substrates.

Recently, LCD devices of several new modes are being developed in order to improve the narrow viewing angle of the related art LCD device. LCD devices with a wide viewing angle are classified into various modes including an in-plane switching (IPS) mode, an optically compensated birefringence (OCB) mode, a fringe field switching (FFS) mode, and other modes.

Among LCD devices with a wide viewing angle, the IPS mode LCD device allows a pixel electrode and a common electrode to be arranged on the same substrate so that a horizontal electric field is induced between the electrodes. As such, major axes of liquid crystal molecules are aligned in a horizontal direction with respect to the substrate. Accordingly, the IPS mode LCD device has a wider viewing angle than that of a TN (Twisted Nematic) mode LCD device of the related art.

FIG. 1 is a view showing a pixel structure in an IPS mode LCD device according to the related art. FIG. 2 is a cross-sectional view showing the pixel structure taken along a line I-I' in FIG. 1.

As shown in FIGS. 1 and 2, a gate line 1 and a data line 5 cross each other so that a pixel region is defined. A thin film transistor TFT is used as a switching element and is disposed at an intersection of the gate and data lines 1 and 5.

On the pixel region, a first common line 3 opposite to the gate line 1 crosses the data line 5. First common electrodes 3a, which are extended from the first common line 3 and parallel to the data line 5, are formed at both sides of the pixel region.

The gate line 1 is configured to include a gate electrode 1a with a widened width. A first storage electrode 6 is disposed adjacent to the gate electrode 1a. The storage electrode 6 is formed in a single body with the first common electrodes 3a.

Also, a second common line 13 electrically connected to the first common line 3 is formed over the first common line 3. Second common electrodes 13a are extended from the second common line 13 toward the pixel region. In addition, third common electrodes 13b partially overlapping the first common electrodes 3a are extended from the second common line 13.

The second common electrodes 13a are alternately disposed with pixel electrodes 7a in the pixel region. The pixel electrodes 7a are extended from a second storage electrode 7 overlapping the first storage electrode 6.

FIG. 2 is a cross-sectional view showing the pixel structure taken along a line I-I' in a region of the data line 5 in FIG. 1.

In FIG. 2, a gate insulation film 12 is formed on a lower substrate 10. The data line 5 is formed on the gate insulation film 12. The first common electrodes 3a arranged at both sides of the data line 5 are formed on the lower substrate 10. The third common electrodes 13b are formed on a protective (or passivation) film 19 and partially overlap the first common electrodes 3a.

The color filter array substrate is configured to include a black matrix 21 which is opposite to the data line 5. The black matrix 21 is formed on an upper substrate 20. A red (R) color filter layer 25a and a green (G) color filter layer 25b are formed along both sides of the black matrix 21. Overcoat 29 is formed on red (R) color filter layer 25a and green (G) color filter layer 25b.

Such an IPS mode LCD device in the related art forces the width L1 of the black matrix 21 to become larger (for example, at least 36 μm) in order to prevent light leakage caused by light that is generated in a backlight unit and that passes around the edges of the pixel region. More specifically, the black matrix 21 is formed to reach to an edge of the first common electrode 3a so as to intercept light passing between the data line 5 and the first common electrode 3a in a direction inclined by at least a constant angle with respect to a vertical line. As a result, an aperture ratio of the pixel region decreases. In addition, since the first common electrodes 3a are arranged at both sides of the data line 5, it is difficult for a thin film transistor array substrate of the related art to increase the aperture ratio of the pixel region.

SUMMARY OF THE INVENTION

Accordingly, the present invention is directed to a thin film transistor array substrate and method for fabricating the same that substantially obviates one or more problems due to limitations and disadvantages of the related art.

An object of the present invention is to provide a thin film transistor substrate and a method for fabricating the same that are adapted to increase an aperture ratio of the pixel region by disposing a common electrode over a data line.

Another object of the present invention is to provide a thin film transistor substrate and a method for fabricating the same that are adapted to increase an aperture ratio of the pixel region by forming a pixel electrode and a common electrode on the substrate.

Still another object of the present invention is to provide a thin film transistor substrate and a method for fabricating the same that are adapted to prevent a disconnection defect by smoothing a tapered surface within a data line region adjacent to a pixel region.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the thin film transistor array substrate and method for fabricating the same includes a thin film transistor array substrate including a substrate, a gate line intersecting a data line to define a pixel region on the substrate, a switching element disposed at an intersection of the gate line and the data line, a plurality of pixel electrodes and a plurality of first common electrodes alternately arranged in the pixel region, a second common electrode overlapping the data line and interposed between a gate insulation film and a protective film, a first storage electrode on the substrate, a second storage electrode overlapping the first storage electrode, and an organic insulation film on the switching element, the second storage electrode, the data line, a gate pad, and a data pad, wherein the second common electrode covers the data line, the protective film, the organic insulation film, and the gate insulation film, and has inclined surfaces connected to the surface of the substrate.

In another aspect, the thin film transistor array substrate and method for fabricating the same includes a method of fabricating a thin film transistor array substrate, comprising the steps of providing a substrate, forming a gate line intersecting a data line to define a pixel region on the substrate, forming a switching element disposed at an intersection of the gate line and the data line, forming a plurality of pixel electrodes and a plurality of first common electrodes alternately arranged in the pixel region, forming a second common electrode overlapping the data line and interposed between a gate insulation film and a protective film, forming a first storage electrode on the substrate, forming a second storage electrode overlapping the first storage electrode, and forming an organic insulation film on the switching element, the second storage electrode, the data line, a gate pad, and a data pad, wherein the second common electrode covers the data line, the protective film, the organic insulation film, and the gate insulation film, and has inclined surfaces connected to the surface of the substrate.

In yet another aspect, the thin film transistor array substrate and method for fabricating the same includes a method of fabricating a thin film transistor array substrate, comprising the steps of providing a substrate, forming a first metal film on the substrate, patterning the first metal film into a gate electrode, a gate line, a first storage electrode and a gate pad through a first mask process, sequentially forming a gate insulation film, a semiconductor layer, and a second metal film on the substrate, forming a plurality of source electrodes, a plurality of drain electrodes, a second storage electrode, a channel layer, and a data line from the second metal film and the semiconductor layer through a second mask process, sequentially forming a protective film and an organic insulation film on the substrate, patterning the organic insulation film to expose a part of the protective film through a third mask process, sequentially performing first and second etching steps in which the patterned organic insulation film is used as an etch mask by using etching gases with different oxygen content ratios, in order to form a pixel region on the substrate, a first contact hole exposing the second storage electrode and a second contact hole exposing the gate pad, forming a third metal film on the substrate, and patterning the third metal film in the pixel region into a pixel electrode and a second common electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 12 is a cross-sectional view showing a cross-sectional structure of a liquid crystal material path taken along a line VII-VII' in FIG. 3;

FIGS. 13A and 13B are cross-sectional views showing a cross-sectional structure of the LCD device taken along a line VIII-VIII' in FIG. 3;

DETAILED DESCRIPTION OF THE EXEMPLARY EMBODIMENTS

Reference will now be made in detail to the embodiments of the present invention, examples of which are illustrated in the accompanying drawings.

Figure 1:
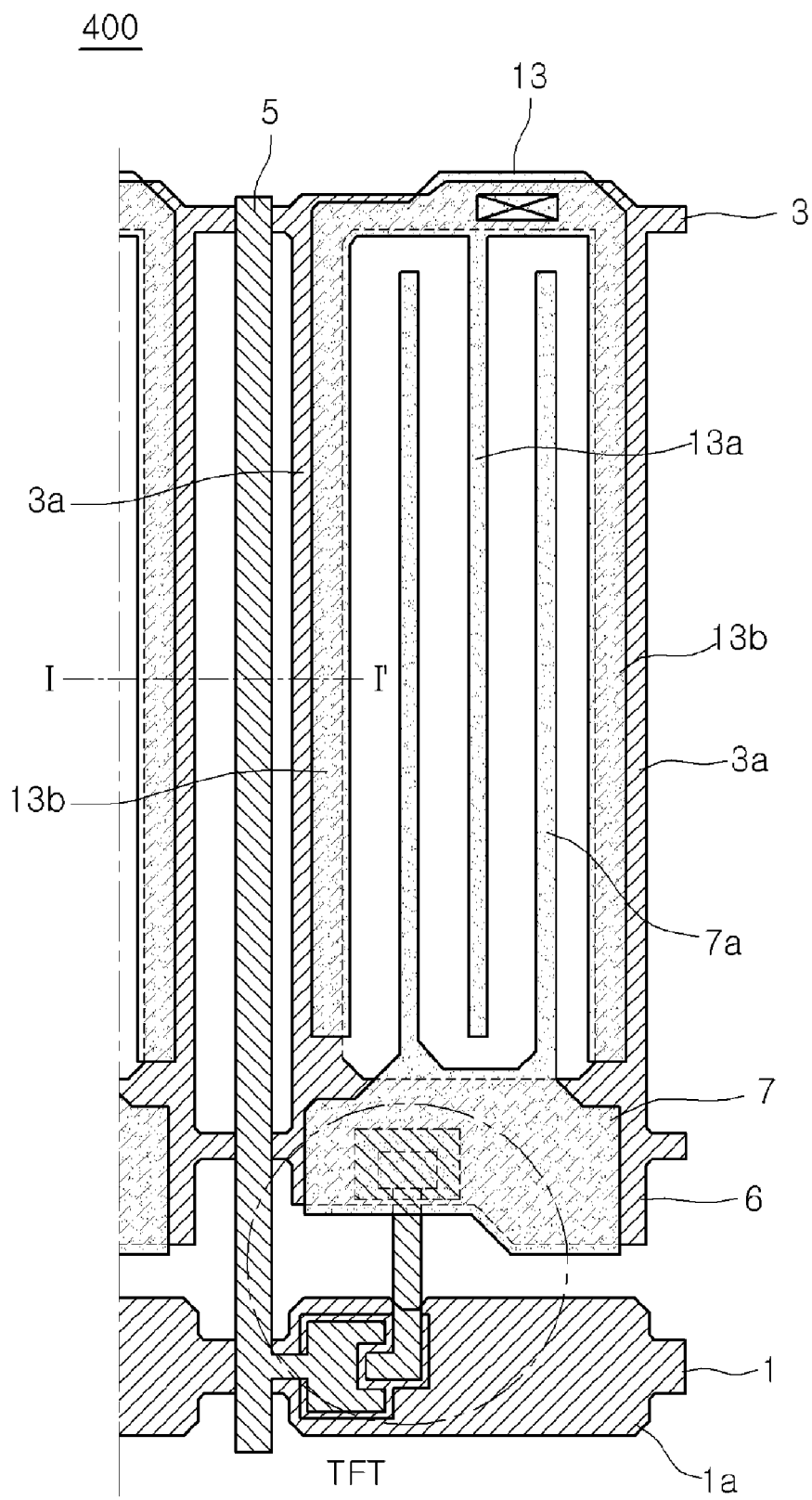
FIG. 1 is a view showing a pixel structure in an IPS mode LCD device according to the related art.
Figure 2:
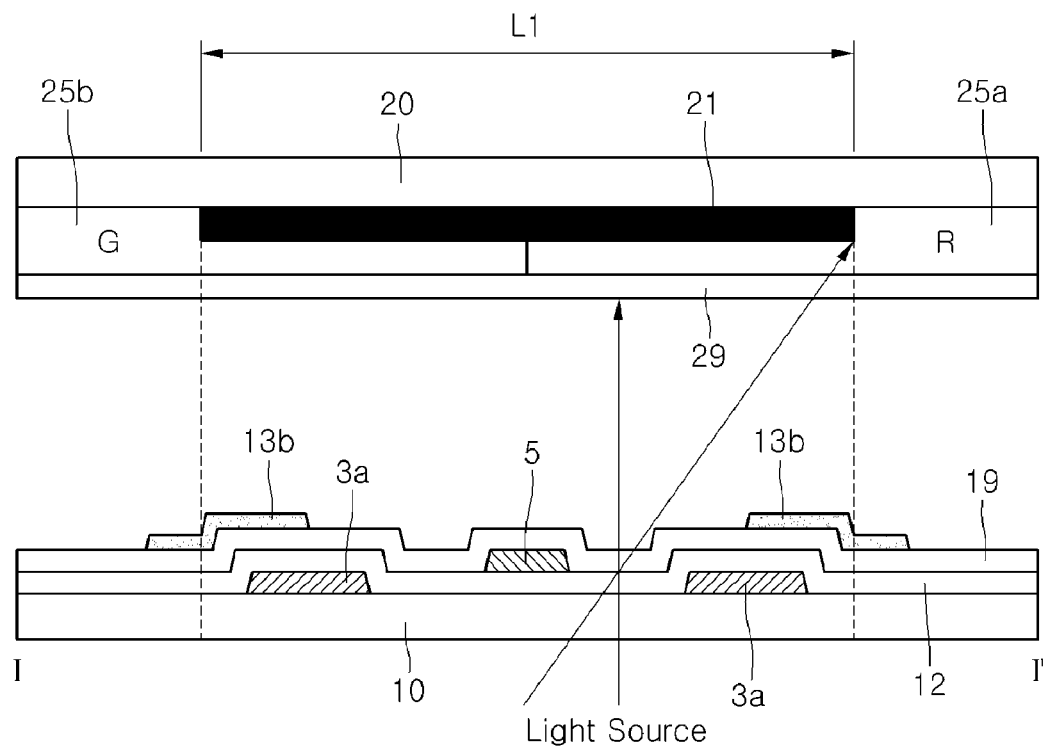
FIG. 2 is a cross-sectional view showing the pixel structure taken along a line I-I' in FIG. 1.
Figure 3:
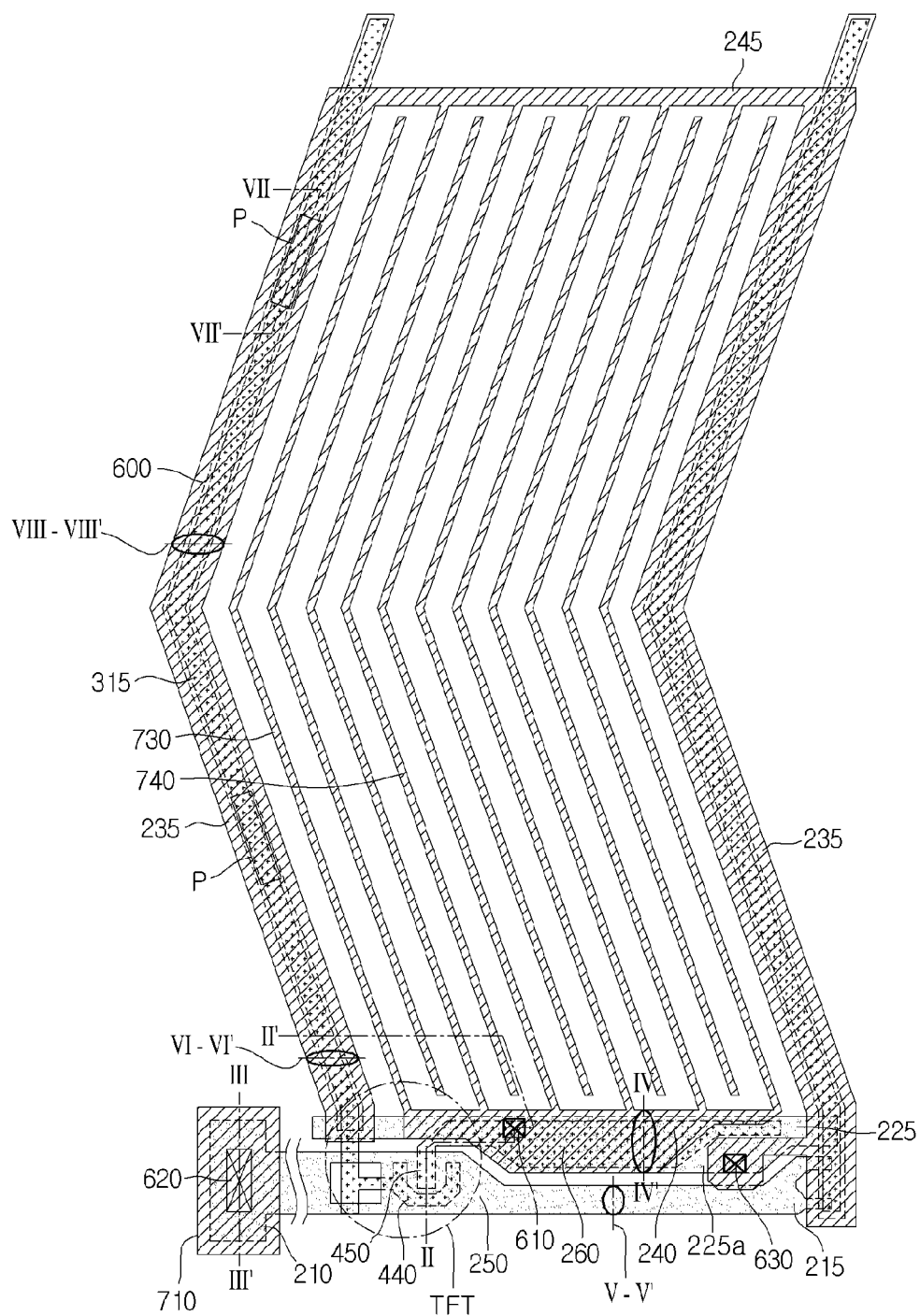
FIG. 3 is a view showing a pixel region of the LCD device according to the first embodiment of the present invention.

FIG. 3 is a view showing a pixel region of the LCD device according to an exemplary first embodiment of the present invention.

As shown in FIG. 3, a LCD device includes a pixel region defined by crossing a gate line 215 and a data line 315. A thin film transistor TFT is disposed at an intersection of the gate line 215 and the data line 315.

A first common line 225 is disposed parallel to the gate line 215 at a position adjacent to the gate line 215. The first common line 225 also crosses the data line 315.

The gate line 215 is formed to have a widened width at the position (area) where it crosses the data line 315. The widened width of the gate line 215 is used as a gate electrode 250 of the thin film transistor TFT. Therefore, the gate electrode 250 and the gate line 215 are formed in a single body. The thin film transistor TFT is configured to include the gate electrode 250, a source electrode 440, a drain electrode 450, and a channel layer (not shown).

Also, a first storage electrode 225a is formed in the pixel region and in a single body with (extended from) the first common line 225. The width of the first storage electrode 225a is wider than that of the first common line 225. The first storage electrode 225a together with a second storage electrode 260 forms a storage capacitor in the pixel region. The second storage electrode 260 is formed opposite to the first storage electrode 225a. The second storage electrode 260 is formed in a single body with (i.e., extended from) the drain electrode 450.

In the pixel region, a first pixel electrode 240 is formed to overlap the first common line 225, and a plurality of second pixel electrodes 730 are extended from the first pixel electrode 240 toward the pixel region and parallel to the data line 315. The plurality of second pixel electrodes 730 are arranged at a fixed interval in the pixel region. In addition, the second storage electrode 260 is electrically connected to a first pixel electrode 240 through the first contact hole 610.

Also, a second common line 245 is formed opposite to the first common line 225 and the first storage electrode 225a in the pixel region. A plurality of first common electrodes 740 are extended from the second common line 245 toward the pixel region and parallel to the data line 315. Also, the first common electrodes 740 are arranged alternately with the second pixel electrodes 730 in the pixel region.

A second common electrode 235 is extended from both ends of the second common line 245 to overlap the data line 315. The second common electrode 235 prevents light leakage caused by light which is generated by a light source of a backlight unit (not shown) and passes through a region of the data line 315. Also, the second common electrode 235 is electrically connected to the first storage electrode 225a through a third contact hole 630. Therefore, a common voltage is applied to the second common electrode 235, first common electrodes 740, and second common line 245 through the first common line 225 and first storage electrode 225a.

Also, an organic insulation film 600 is interposed between the second common electrode 235 and the data line 315. Furthermore, the LCD device of the present embodiment provides a path P for a liquid crystal material, which allows the liquid crystal material to flow between pixel regions adjacent to each other around the data line 315. The path P for a liquid crystal material is formed by completely removing the organic insulation film 600 from around the data line or by forming the organic insulation film 600 at the region adjacent to (or around) the data line in a thinner thickness than other region.

Meanwhile, a gate pad 210 extended from the gate line 215 is formed in a pad region of the LCD device. A gate pad contact electrode 710 is formed in contact with the gate pad 210. The gate pad contact electrode 710 electrically contacts with the gate pad 210 through a second contact hole 620.

FIGS. 4A to 8B are cross-sectional views which explain a method of fabricating a LCD device and illustrate a cross-sectional structure of the thin film transistor array substrate taken along lines II-II' and III-III' in FIG. 3.

Figure 4A:
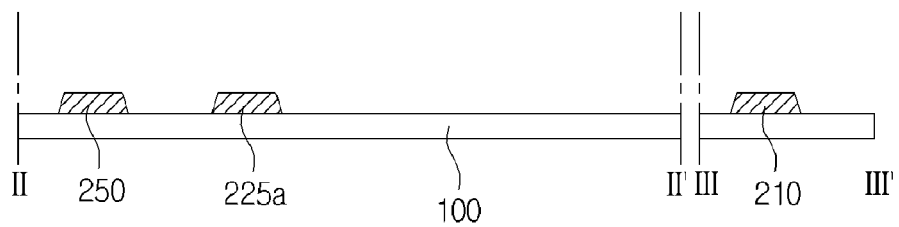
FIGS. 4A, 5A, 6A to 6C, 8A, and 8B are cross-sectional views that show a thin film transistor array substrate taken along lines II-II' and III-III' in FIG. 3 and explain methods of fabricating LCD devices according to the first embodiment of the present invention.
Figure 4B:
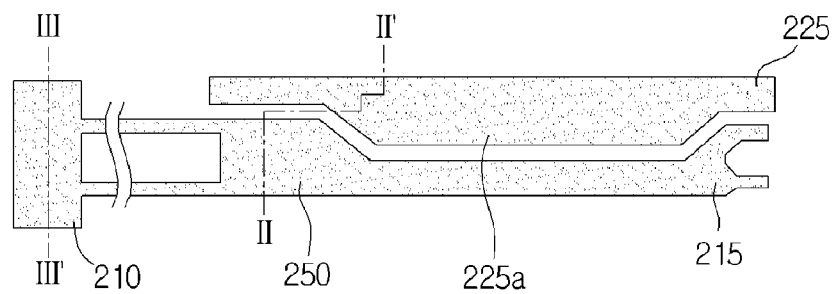
FIG. 4B is a view showing a planar structure of the thin film transistor array substrate of FIG. 4A.

As shown in FIGS. 4A and 4B, a first metal film is deposited on a lower substrate 100 of a transparent insulation material by a sputtering method. Then, an etching step is performed for the deposited metal film in a first mask process.

In the first mask process, a photo-resist including a light sensitive material is first formed on the deposited metal film. The photo-resist is then exposed and developed by using a mask having transmission regions and non-transmission regions, thereby forming a photo-resist pattern. Thereafter, the deposited metal film is etched by using the photo-resist pattern as a mask so that a gate electrode 250, a first storage electrode 225a, and a gate pad 210 are formed. FIG. 4B illustrates that gate line 215 and a first common line 225 are also formed at the same time. The gate line 215 is formed in a single body with the gate electrode 250. The first common line 225 is formed in a single body with the first storage electrode 225a.

The first metal film may be formed from one material that is selected from a group of molybdenum Mo, titanium Ti, tantalum Ta, Tungsten W, copper Cu, chrome Cr, aluminum Al, their alloys, and their combinations. Although the metal film is formed in a single layer as shown in the drawings, the metal film may also be formed by stacking at least two metal layers.

Figure 5A:
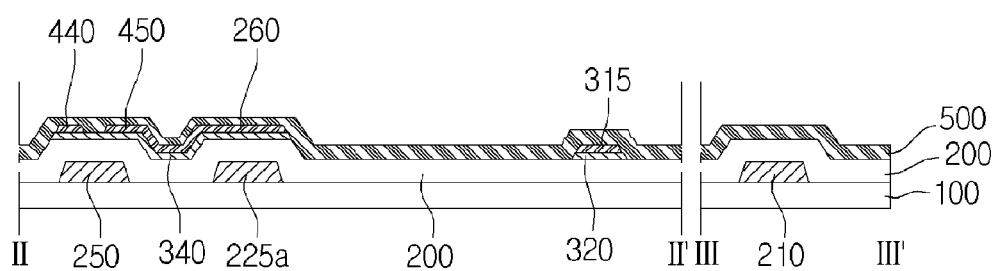
Figure 5B:
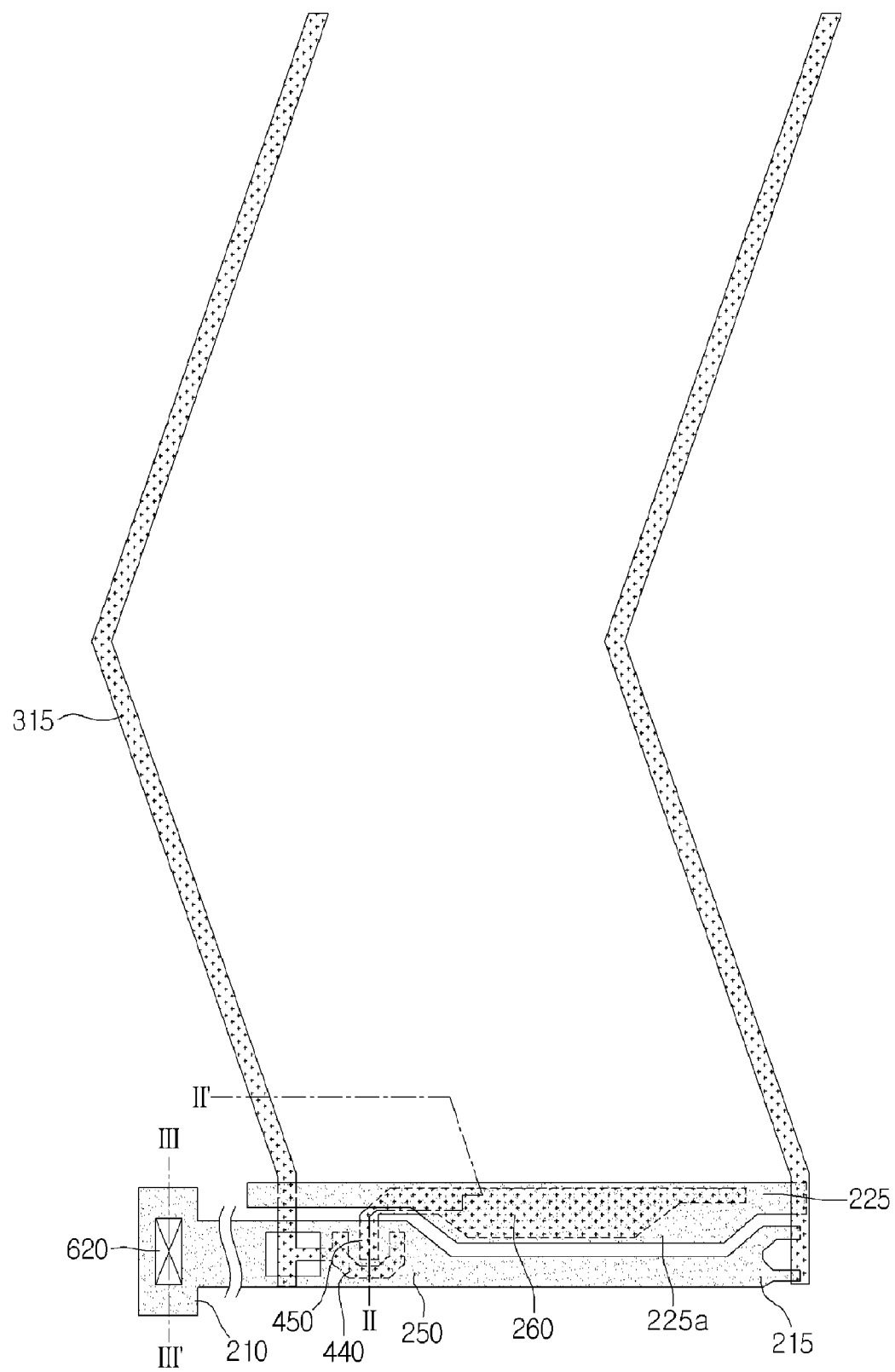
FIG. 5B is a view showing a planar structure of the thin film transistor array substrate of FIG. 5A.

FIG. 5B is a view showing a planar structure of the thin film transistor array substrate of FIG. 5A.

As shown in FIGS. 5A and 5B, after the gate electrode 250 and so on are formed on the lower substrate 100, a gate insulation film 200, a semiconductor layer of an amorphous silicon film and a doped amorphous silicon film (n+ or p+), and a second metal film are sequentially formed on the lower substrate 100 with the above electrodes 250 and 225a and pad 210.

The second metal film may be formed from one material that is selected from a group of molybdenum Mo, titanium Ti, tantalum Ta, Tungsten W, copper Cu, chrome Cr, aluminum Al, their alloys, and their combinations. Also, a transparent conductive material such as ITO (Indium Tin Oxide) may be used as the second metal film. Furthermore, although the second metal film is formed in a single layer as shown in the drawings, the second metal film may also be formed by stacking at least two metal layers.

Subsequently, a second mask process using one of a half tone mask and a diffractive mask is performed on the lower substrate 100 covered with the second metal film, in order to form source electrodes 440, drain electrodes 450, a second storage electrode 260, a data line 315 from the second metal film, and a channel layer 340 from the semiconductor layer. Although it is not shown in the drawings, a data pad is formed at the same time.

As a half tone mask or diffractive mask is used, the channel layer pattern 320 exists under the data line 315. A storage capacitor is formed between the first storage electrode 225a and the second storage electrode 260, as shown in FIG. 5B. Thereafter, a protective film 500 is formed on the entire surface of the lower substrate 100.

Figure 6A:
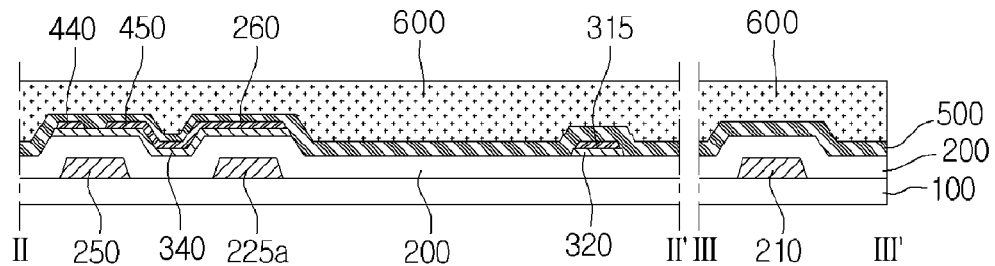
Figure 6B:
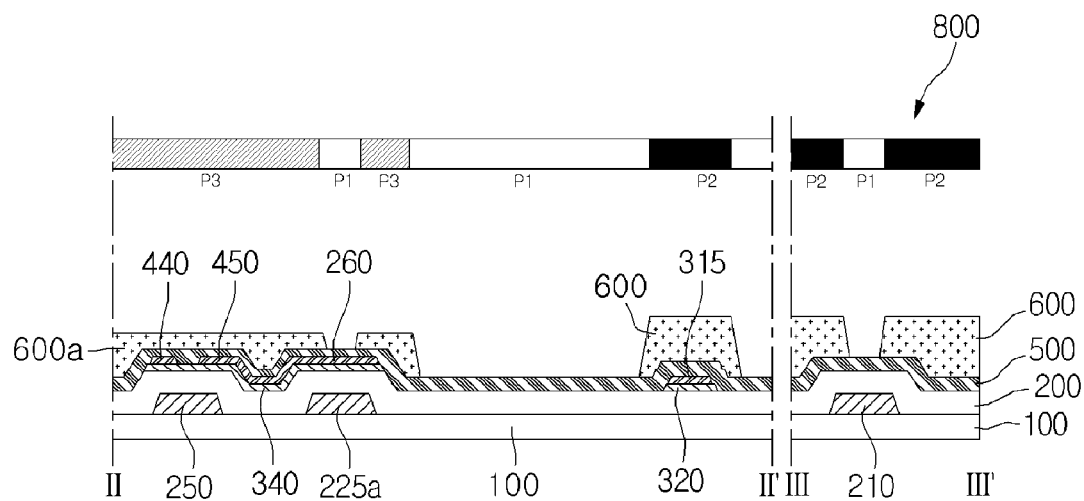

As shown in FIGS. 6A to 6C and 7, an organic insulation film 600 is formed on the protective film 500. Afterward, a third mask process is performed in which a mask 800 having full transmission regions P1, non-transmission regions P2, and half transmission regions P3 is used for the lower substrate 100 on which the organic insulation film 600 is formed. This third mask process completely removes the organic insulation film 600 corresponding to the full transmission regions P1 of the mask 800 to expose the protective film, partially removes the organic insulation film 600 corresponding to the half transmission regions P3 of the mask 800 to reduce the thickness of the protective film 500, and maintains (i.e., does not remove) the protective film 600 corresponding to the non-transmission regions P2 of the mask 800, as shown in FIG. 6B.

The organic insulation film 600 has a lower dielectric constant than the protective film 500. The organic insulation film 600 may have a dielectric constant of about 3.0~4.0. It is preferable for the organic insulation film 600, which is interposed between the data line 315 and the second common electrode 235 (as shown in FIG. 8B) to have a dielectric constant of about 3.4~3.8. The organic insulation film 600, which is interposed between the data line 315 and the second common electrode 235, may have a thickness in a range of about 3~6 μm. Alternatively, the thickness of the organic insulation film 600 may be varied depending on a driving frequency of the LCD device.

As the driving frequency increases, the coupling effect generated between the data line 315 and the second common electrode (235 in FIG. 3) that will be formed later on the organic insulation film 600 causes a signal delay. However, the LCD device employs the organic insulation film 600 with a low dielectric constant so that the parasitic capacitance, which is generated between the data line 315 and the second common electrode 235, is reduced. Therefore, the signal delay may be prevented.

More specifically, the parasitic capacitance is inversely proportional to the distance between the data line 315 and the second common electrode 235. Therefore, the larger the thickness of the organic insulation film 600 between the data line 315 and the second common electrode 235, the smaller the parasitic capacitance. As a result, the signal delay caused by the coupling effect between the data line 315 and the second common electrode 235 may be reduced.

For example, if the driving frequency of the LCD device is set to 120 Hz, the thickness of the organic insulation film 600 between the data line 315 and the second common electrode 235 may be in a range of about 2.5~3.5 µm. Alternatively, the thickness of the organic insulation film 600 may be in a range of about 5.5~6.5 µm when the LCD device has a driving frequency of 240 Hz. In this way, since the thickness is not set to a fixed value when designing the LCD device, it may be changed according to a specification of the LCD device. Also, the position of the second common electrode 235 may be changed in order to prevent light leakage and improve the aperture ratio of the pixel region. In this case, the organic insulation film 600 may be thinner or thicker depending on the driving frequency.

In addition, the organic insulation film 600 may be formed from an acrylic-based resin. The acrylic-based resin includes a photo acryl, but it is not limited thereto. In other words, if a material for the organic insulation film 600 has a low dielectric constant, the organic insulation film 600 is not limited to the photo acryl.

As mentioned above with reference to FIG. 6B, the third mask process adopted in the method of fabricating a LCD device performs exposing and developing steps for the lower substrate 100 to completely and partially remove the organic insulation film 600. In other words, at this time, the organic insulation film 600 is patterned by the exposing and developing steps.

Figure 6C:
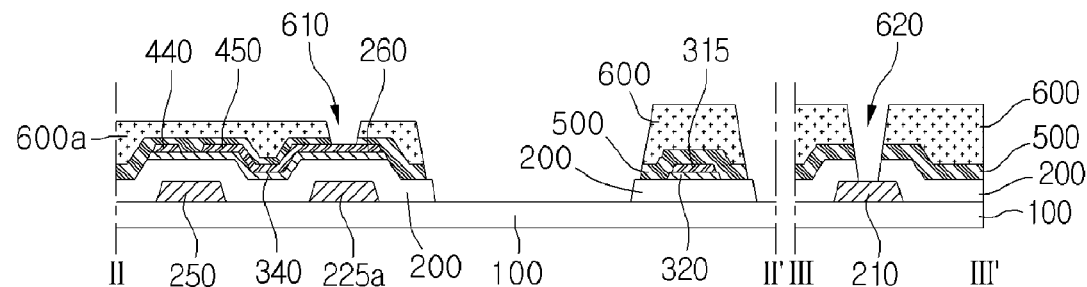

After the exposing and developing steps, an etching step is performed by using the patterned organic insulation film 600 as a mask. In the etching step, as shown in FIG. 6C, a part of the lower substrate 100 is exposed to form a pixel region. Also, a first contact hole 610 is formed to expose a part of the second storage electrode 260 which is formed in a single body with the drain electrode 450. Furthermore, a second contact hole 620 is formed to expose (a part of) the gate pad 210.

At this time, the protective film 500 and the gate insulation film 200, which are formed around the data line 315, are sequentially etched. As such, tapered surfaces that are formed adjacent to both sides of the data line are smoothed, because the half tone mask or the diffractive mask is used in the third mask process. Similarly, the protective film 500 and the gate insulation film 200, which are stacked over the gate pad 210, are also sequentially etched to form the second contact hole 620. However, only the protective film 500 is etched to form the first contact hole 610 that exposes a part of the second storage electrode 260. In addition, the third mask process adopted in the method of the present embodiment performs two etching steps by using gases with different oxygen content ratios. As such, the edge surfaces of the protective film 500 and the gate insulation film 200 are smoothed. Therefore, the second common electrode which is formed to cover the data line 315 later has a top surface on the organic insulation film 600 and two smoothly inclined surfaces that reach the surface of the lower substrate 100. As a result, the disconnection caused by poor step coverage (i.e. a steep step portion) at the boundary between the second common electrode 235 and the pixel region may be prevented.

Also, as mentioned above, the present embodiment forms a thinner organic insulation film 600 on the thin film transistor and the storage capacitor. As such, the thickness of the organic insulation film 600 on the thin film transistor and the storage capacitor is reduced. In addition, the organic insulation film 600 and the protective film 500 remaining over the data line 315 and the gate insulation film 200 remaining under the data line 315 has tapered surfaces at both sides of the data line 315 whose continuity is improved due to the use of the half tone mask or the diffractive mask.

Figure 7:
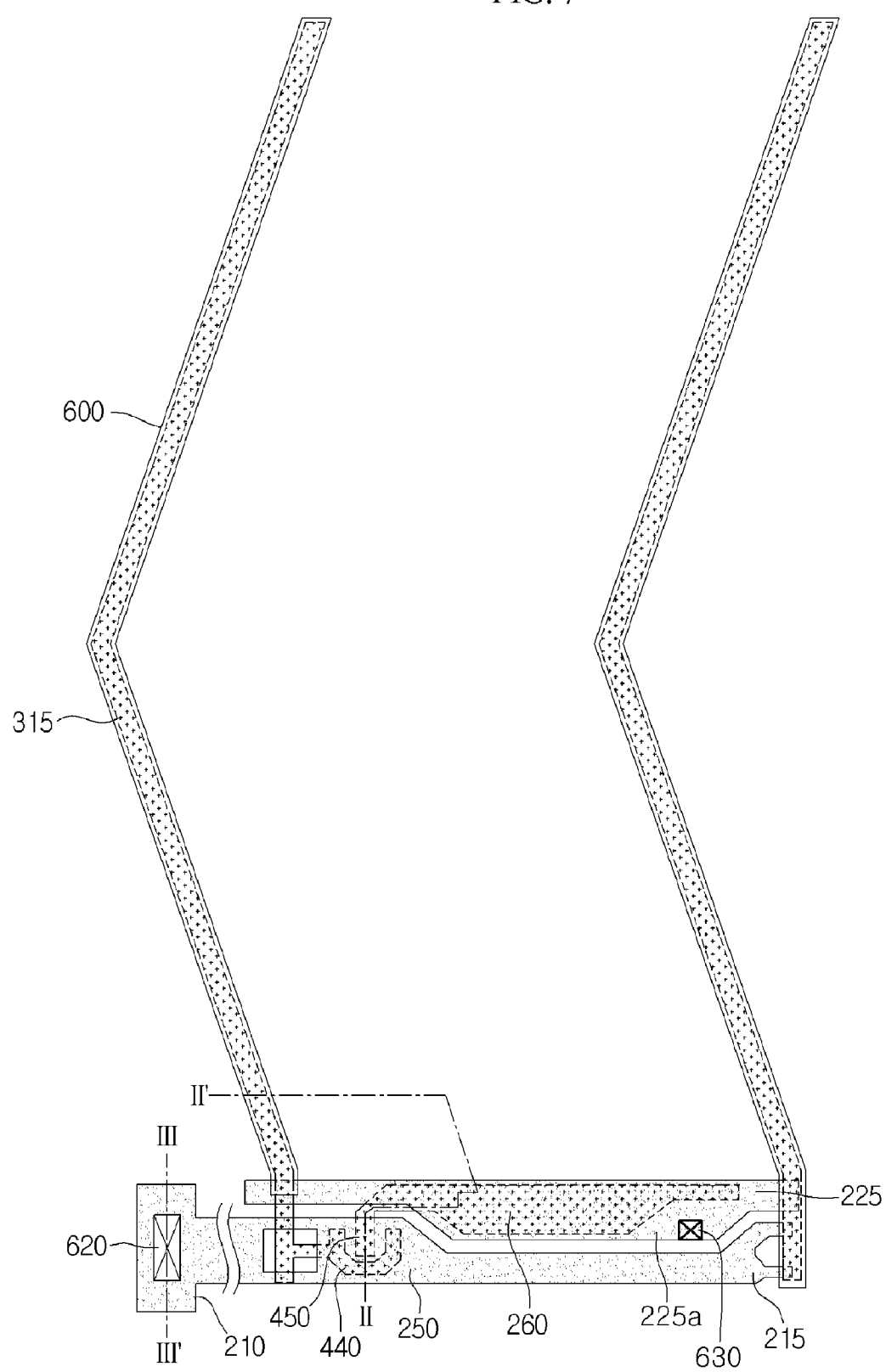
FIG. 7 is a view showing a planar structure of the thin film transistor array substrate of FIG. 6C.

Furthermore, a third contact hole 630 is formed corresponding to the first storage electrode 225a through the third mask process, as shown in FIG. 7.

The second and third contact holes 620 and 630 may be formed by etching both of the protective film 500, and the gate insulation film 200. To this end, only a dry etching step may be employed in the related art. In this case, the organic insulation film 600 remains within the holes after the exposing and developing process. As such, the inner side surface of each contact hole becomes rough due to the remaining organic insulation film 600, and a tapered inner side surface defect is generated in the contact holes.

On the other hand, the third mask process performs two etching steps by using etching gases with different oxygen content ratios, as described above. Therefore, such a tapered inner side surface defect is not generated in the contact holes.

Figure 8A:
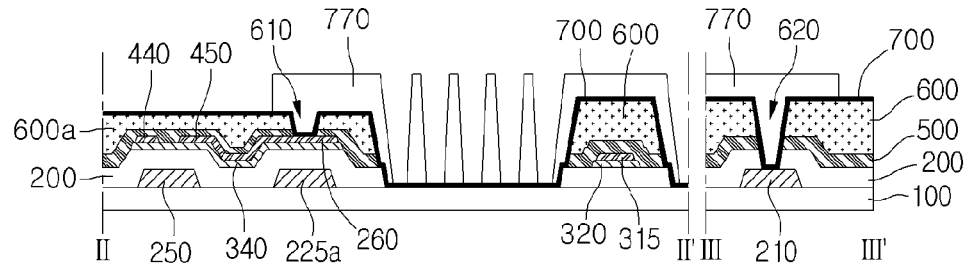
Figure 8B:
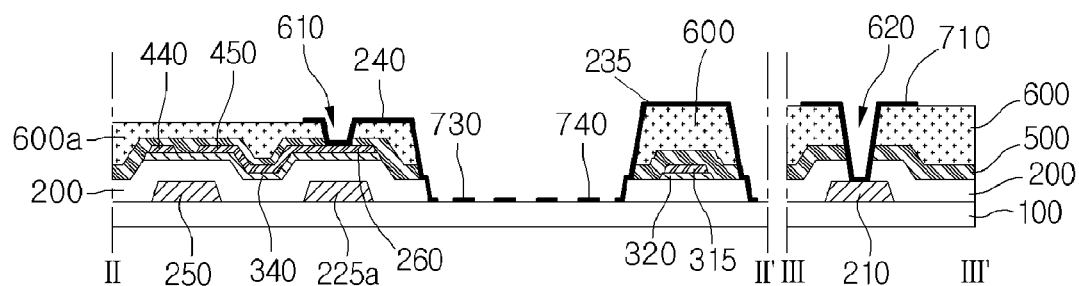

As shown in FIGS. 8A and 8B, a third metal film 700 is formed on the lower substrate 100 with the contact holes, and then a photo-resist film 770 is coated on the third metal film 700. Subsequently, a fourth mask process including exposing and developing steps is performed on the photo-resist film 770 and the third metal film 700 such that the third metal film 700 is patterned into a first pixel electrode 240, first common electrodes 740, second pixel electrodes 730, a second common electrode 235, and a gate pad contact electrode 710.

The third metal film may be formed from one material that is selected from a group of molybdenum Mo, titanium Ti, tantalum Ta, Tungsten W, copper Cu, chrome Cr, aluminum Al, their alloys, and their combinations. Also, a transparent conductive material such as ITO (Indium Tin Oxide) or IZO (Indium Zinc Oxide) may be used for the third metal film. Furthermore, although the third metal film is formed in a single layer as shown in the drawings, the third metal film may also be formed by stacking at least two metal layers.

The first common electrodes 740, the second common electrode 235, and the gate pad contact electrode 710 may be formed from an opaque metal, and the first pixel electrode 240 and second pixel electrode 730 may be formed from a transparent conductive material. In this case, the mask process is performed twice.

In order to remove a black matrix from the color filter array substrate or reduce the width of the black matrix, the second common electrode 235 in the LCD device of the present embodiment is preferably formed from an opaque metal. On the contrary, the first pixel electrode 240, the first common electrodes 740, the second pixel electrodes 730, the second common electrode 235, and the gate pad contact electrode 710 may be formed from a transparent conductive material. In this case, a black matrix is formed on the color filter array substrate opposite to the data line 315.

The first pixel electrode 240 is connected to the second storage electrode 260 through the first contact hole 610. The second pixel electrodes 730 and the first common electrodes 740 are arranged alternately with each other in the pixel region of the lower substrate 100 and parallel to the data line 315.

The second common electrode 235 is formed to cover the data line 315. In other words, the second common electrode 235 is formed on the surface of the organic insulation film 600 covering the data line 315, i.e. on the horizontal surface of the organic insulation film 600 over the data line 315 and the inclined side surfaces of the organic insulation film 600 at both sides of the data line 315. Consequently, the second common electrode 235 is formed to cover entirely the gate insulation film 200 beneath the data line 315, as well as the protective film 500 and the organic insulation film 600, which are deposited on the data line 315.

Such a second common electrode 235 shields an electric field formed between the data line 315 and the second pixel electrodes 730. As such, the light leakage caused along the data line 315 may be prevented.

Also, since the organic insulation film 600 is formed from a material having a lower dielectric constant than that of the protective film 500, a parasitic capacitance generated between the second common electrode 235 and the data line 315 may be reduced. Therefore, the signal delay caused by the coupling effect may be reduced.

The gate pad contact electrode 710 is electrically connected to the gate pad 210 through the second contact hole 620. Although it is not shown in the drawings, a data pad contact electrode in a data pad region is also electrically connected to a data pad.

Figure 9:
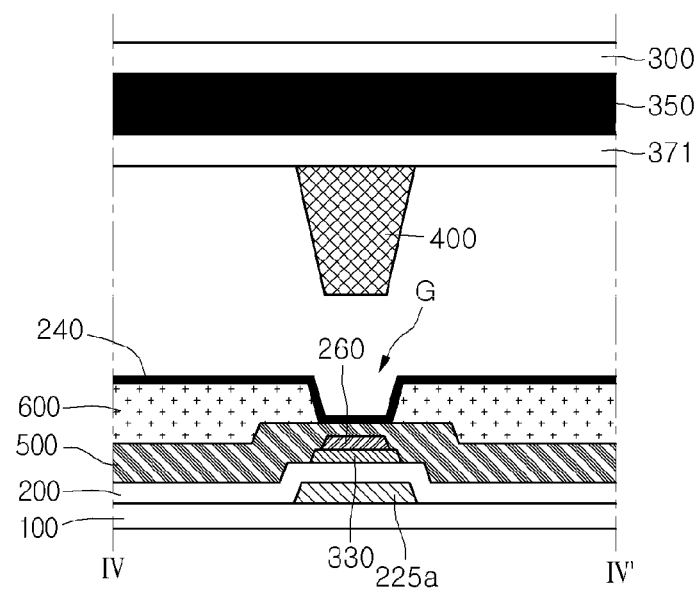
FIGS. 9 to 11 are cross-sectional views showing a cross-sectional structure of the LCD device taken along lines V-V' and VI-IV' in FIG. 3.
Figure 10:
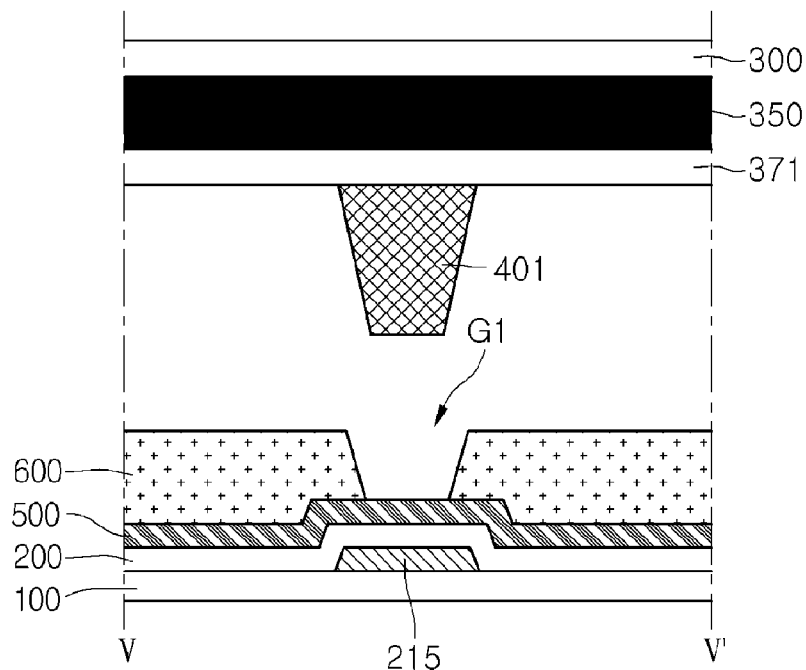
Figure 11:
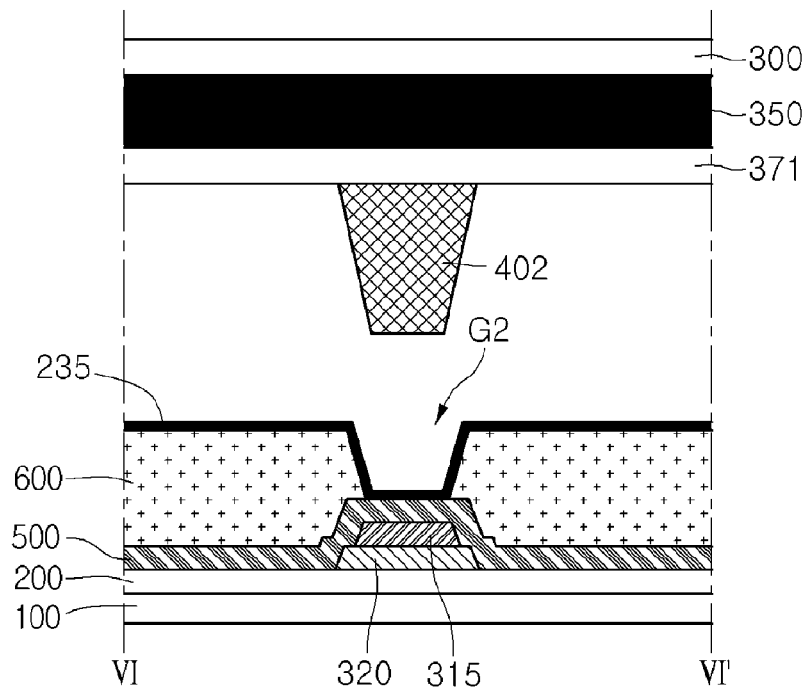

FIGS. 9 to 11 are cross-sectional views showing a cross-sectional structures of the LCD device, which are taken respectively along lines IV-IV', V-V' and VI-IV' in FIG. 3.

The LCD devices may be configured to include spacers of two types. One type of the spacer is a gap column spacer, which maintains a constant cell gap between a color filter array substrate and a thin film transistor array substrate, and the other type of the spacer is a touch column spacer for preventing damage of the gap column spacer by externally pressing. The gap column spacer is being applied to a LCD device of the related art. As such, description will now be made with respect to the touch column spacer which is formed together with the gap column spacer.

FIGS. 9 to 11 show a touch column spacer 400. The positions of the gap column spacer (not shown) and the touch column spacer may be freely changed because the spacers are not limited to their positions.

The touch column spacer 400 adopted in the LCD device disperses a bearable force of the gap column spacer when a display area of the LCD device is pressed by an external force. If the LCD device is configured to include only the gap column spacer, the gap column spacer is broken or loses its restorative power. However, when a part of the display area of the LCD device is pressed by an external force that is larger than a predetermined force, the touch column spacer 400 together with the gap column spacer maintains the cell gap of the LCD device.

The touch column spacer 400 shown in FIG. 9 is disposed corresponding to the storage capacitor. As shown in FIGS. 3 and 9, a first storage electrode 225a in a single body with a first common electrode 225 is formed on the lower substrate 100. Also, a gate insulation film 200, a protective film 500, an organic insulation film 600, and a second storage electrode 260 are sequentially formed on the first storage electrode 225a. A channel layer pattern 330 is disposed between the first storage electrode 225a and the second storage electrode 260.

On the other hand, a black matrix 350 and an overcoat 371 are sequentially formed on an upper substrate 300 of the color filter array substrate opposite to the lower substrate 100. Also, a touch column spacer 400 may be formed on the overcoat layer 371 corresponding to the second storage electrode 260 on the lower substrate 100.

In addition, a groove G is formed on the organic insulation film 600 opposite to the touch column spacer 400. The groove G may be formed by completely or partially removing the organic insulation film 600 on the second storage electrode 260.

As shown in FIGS. 3, 10, and 11, another touch column spacer 401 may be formed on the overcoat layer 371 of the upper substrate 300 opposite to the gate line 215 (FIG. 10), and still another touch column spacer 402 may be formed on the overcoat layer 371 of the upper substrate 300 opposite to the data line 315 (FIG. 11). In FIG. 10, another groove G1 is formed over the gate line 215 opposite to the another touch column spacer 401 by completely removing the organic insulation film 600 on the protective film 500. As such, the protective film 500 is exposed by another groove G1.

Similarly, still another groove G2 is formed over the data line 315 opposite to still another touch column spacer 402 by removing the organic insulation film 600 on the protective film 500 opposite to the still another touch column spacer 402 (FIG. 11). Subsequently, the second common electrode 235 is formed on the organic insulation film 600. In detail, the second common electrode 235 is formed on the organic insulation film 600, the inner side surface of still another groove G2, and the exposed protective film 500. Alternatively, the organic insulation film 600 may remain in the still another groove G2 with a smaller thickness than in other regions adjacent to the still another groove G2. This may be implemented by the half transmission region of the half tone mask or the diffractive mask.

If a part of the display area of the LCD device which is configured to include the touch column spacer 400 and the gap column spacer is pressed, the gap column spacer endures to maintain the cell gap until the touch column spacer 400 comes in contact with the bottom surface of the groove G. The gap column spacer together with the touch column spacer 400 maintains the cell gap when the touch column spacer comes in contact with the bottom surface of the groove G. In other words, the LCD device of the present embodiment allows only the gap column spacer or all of the gap column spacer and touch column spacer to maintain the cell gap in response to the strength of a force pressing on a part of the display area.

FIG. 12 is a cross-sectional view showing a cross-sectional structure of a path for the liquid crystal material taken along a line VII-VII' in FIG. 3.

As shown in FIGS. 3 and 12, the organic insulation film 600, protective film 500, and gate insulation film 200 are all removed from the pixel region of the LCD device of the present embodiment. On the contrary, the organic insulation film 600 is formed on a non-display area which is located between the pixel regions. As such, a liquid crystal material is put into each of the pixel regions. Therefore, the pixel regions may be filled with the liquid crystal material to the same height.

In other words, the liquid crystal material is not distributed uniformly in the entire pixel regions due to the organic insulation film 600 formed over the data line 315, even though the liquid crystal material is over-filled or under-filled in some pixel regions. If the liquid crystal material is filled in the pixel regions to different degrees (or to different heights), a defect such as a stain is generated. In addition, when the liquid crystal material over-filled in one pixel region is burst, the spacer or the organic insulation film 600 in a non-display area adjacent to the pixel region over-filled with the liquid crystal material may be damaged. Therefore, the screen quality of the LCD device may be deteriorated.

In order to uniform the filled degree (height) of liquid crystal material in all of the pixel regions, the LCD device of the present embodiment is provided with a path P for the liquid crystal material which is formed between the adjacent pixel regions. The path P allows the liquid crystal material to flow between the adjacent pixel regions.

As shown in the drawings, the gate insulation film 200, the channel layer pattern 320, the data line 315, the protective film 500, the organic insulation film 600, and the second common electrode 235 are sequentially formed on the lower substrate 100. The path P for the liquid crystal material is formed by entirely or partially removing the organic insulation film 600 overlapping the data line 315.

The path P for the liquid crystal material is formed to have the same length as the width of the data line 315. Also, the width of the path P for the liquid crystal material may be selectively adjusted. Furthermore, at least one path P for the liquid crystal material may be formed in each pixel region.

Figure 13B:
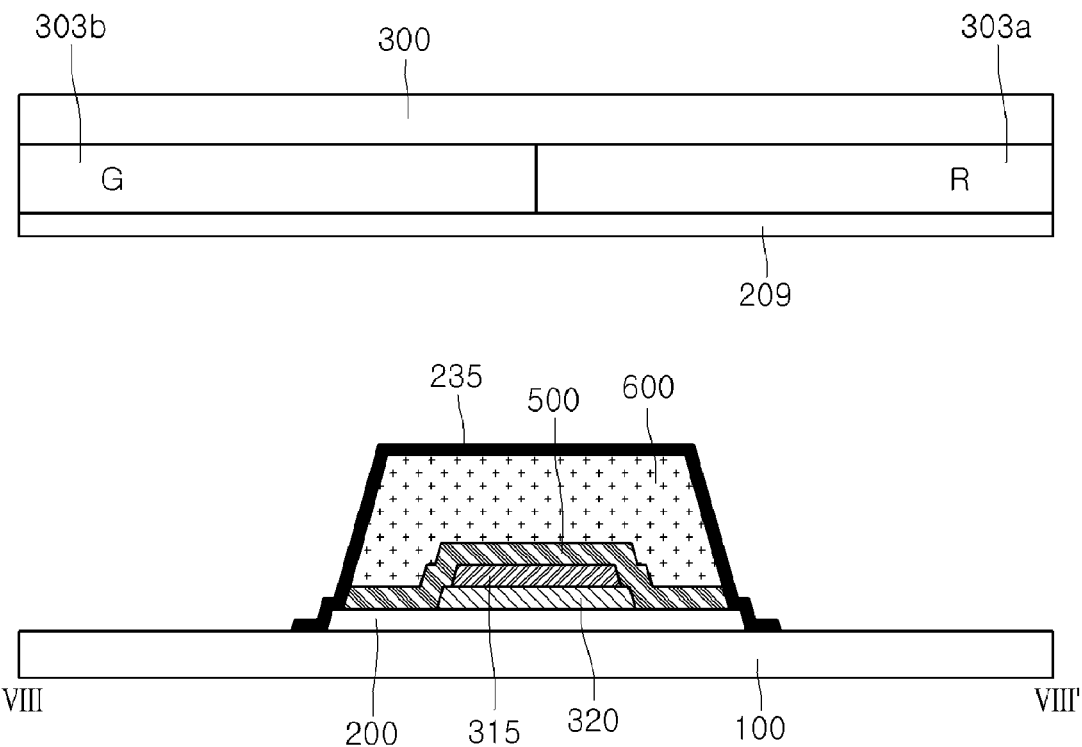

FIGS. 13A and 13B are cross-sectional views showing a cross-sectional structure of the LCD device taken along a line VIII-VIII' in FIG. 3.

As shown in FIGS. 13A and 13B, structures of the thin film transistor array substrate and the color filter array substrate in a region of the data line 315 are shown.

The channel layer pattern 320 and the data line 315 are sequentially formed on the gate insulation film 200 of the lower substrate 100. Also, the protective film 500 and the organic insulation film 600 are sequentially formed on the data line 315. Furthermore, the second common electrode 235 is formed on the organic insulation film 600 to cover the data line 315. In other words, the second common electrode 235 is formed to cover the organic insulation film 600, the protective film 500, and the gate insulation 200 and have inclined surfaces which reach the lower substrate 100.

Such a second common electrode 235 is formed from an opaque metal. As such, the second common electrode 235 shields light that enters from the rear surface of the lower substrate 100. The second common electrode 235 may be formed from one material that is selected from a group of molybdenum Mo, titanium Ti, tantalum Ta, Tungsten W, copper Cu, chrome Cr, aluminum Al, their alloys, and their combinations.

Moreover, the black matrix 350 formed on the color filter array substrate opposite to the second common electrode 235 may also be reduced to a smaller width than that in the related art. The black matrix 350 is formed to have a width in a range between the widths of the second common electrode 235 and the data line 315. For example, the black matrix 350 may have a width in a range of about 6~16 μm.

In this manner, the above reduced width of the black matrix 350 allows a red (R) color filter layer 303a, a green (G) color filter layer 303b, and a blue (B) color filter layer (not shown) to be formed with a larger dimension (i.e., an enlarged size). Accordingly, the aperture ratio of the LCD device may be improved.

FIG. 13B shows a color filter array substrate from which the black matrix is completely removed. In this case, the second common electrode 235 on the thin film transistor array substrate is used as the black matrix. As the black matrix is removed from the LCD device (i.e., the color filter array substrate), compared to FIG. 13A, the LCD device shown in FIG. 13B may have a larger aperture ratio.

Figure 14A:
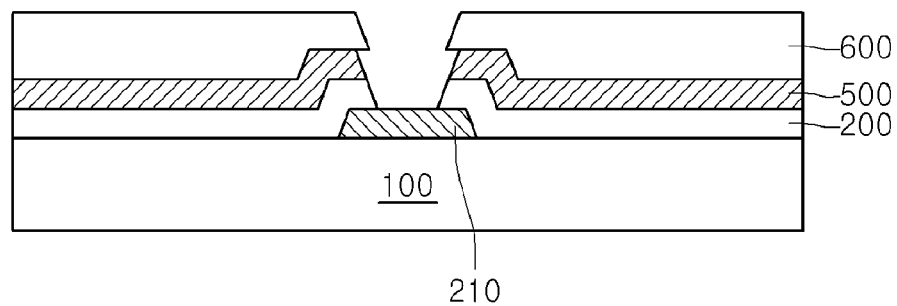
FIGS. 14A and 14B are views used to explain problems caused by applying an etching method in the related art to a contact hole formation process.
Figure 14B:
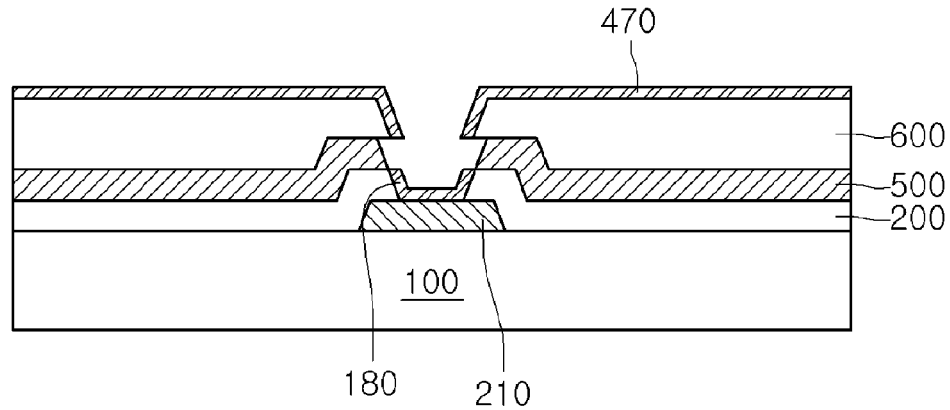

FIGS. 14A and 14B are views used to explain problems caused by applying an etching method in the related art to a contact hole formation process.

As shown in FIGS. 14A and 14B, the thin film transistor array substrate of the present embodiment is configured to include the gate pad 210 formed in the gate pad region of the lower substrate 100. The thin film transistor array substrate is further configured to include the gate insulation film 200, the protective film 500, and the organic insulation film 600 which are sequentially formed on the gate pad 210.

In order to expose the gate pad 210, a dry etching process in the related art may be employed. In this case, the organic insulation film 600 remains within the hole after the exposing and developing process. Therefore, the inner side surface of the hole becomes rough due to the remaining organic insulation film 600.

As shown in FIG. 14A, the organic insulation film 600 remaining within the hole forms an under cut structure in a lower portion of the organic insulation film 600. In other words, a step-coverage is generated among the organic insulation film 600, the protective film 500, and the gate insulation film 200.

The step-coverage generated within the hole causes a disconnection in a metal film 470 which will be formed later, as shown in FIG. 14B. Actually, an electrical disconnection may be caused in a gate pad contact electrode which is formed in the gate pad region, by the step-coverage formed on the inner side wall of the contact hole. The metal film 470 may have a structure where at least two metal layers are stacked.

To address this matter, the present embodiment varies a content ratio of an etching gas and performs the etching process twice, when forming the contact hole.

Figure 15A:
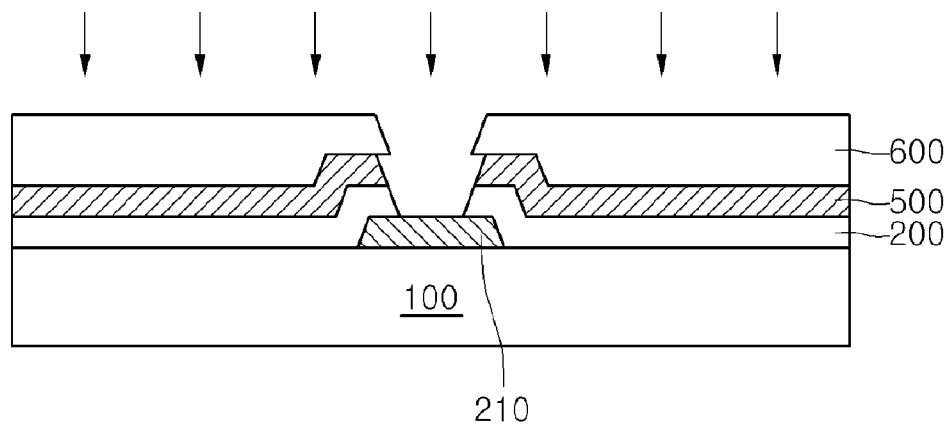
FIGS. 15A to 15C are views used to explain an etching process during a contact hole formation of a first embodiment of the present invention.
Figure 15B:
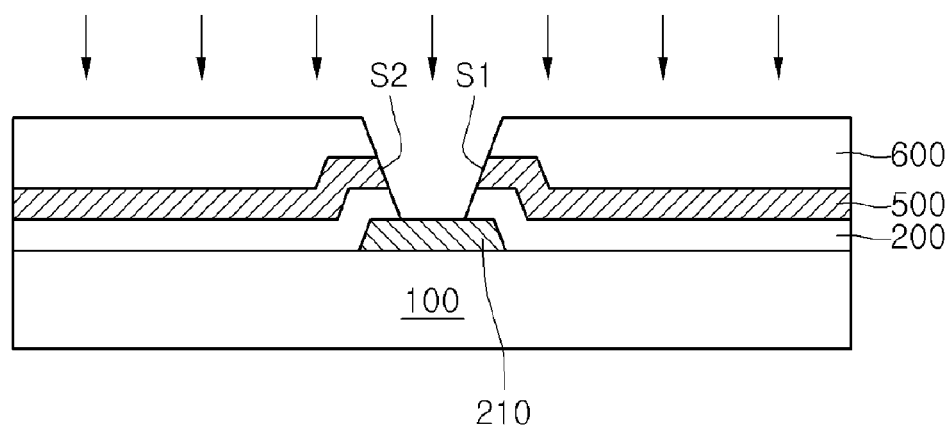
Figure 15C:
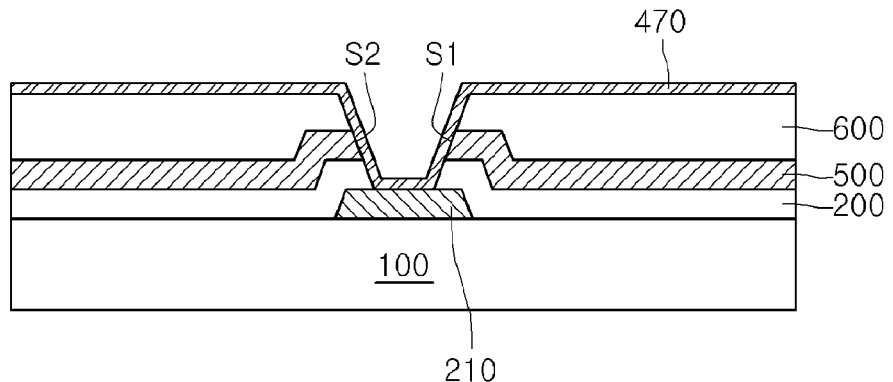

FIGS. 15A to 15C are views used to explain an etching process during a contact hole formation of the present embodiment. This etching process may be applied intact to the third mask process illustrated in FIGS. 6A to 7.

As shown in FIGS. 15A to 15C, the gate pad 210 is formed on the lower substrate 100. Thereafter, the gate insulation film 200, the protective film 500, and the organic insulation film 600 are sequentially formed on the gate pad 210.

The organic insulation film 600 is patterned by a mask process before a first etching process is performed, the patterned organic insulation film will be used as a mask in the first etching process. A flow ratio of an etching gas of SF6:O2 used in the first etching process may be in a range of about 1:2.0~1:3.0. It is preferable for the etching gas of SF6:O2 to have a flow ratio of about 1:2.5. For example, if SF6 corresponds to 4000, O2 is in a range of about 10000~12000.

Subsequently, the flow ratio of the etching gas of SF6:O2 is varied and then a second etching process is performed. At this time, the flow ratio of SF6:O2 may be in a range of about 1:2.4~1:3.0. It is preferable for SF6:O2 to be set to a flow ratio of about 1:2.5.

In other words, if the content of O2 gas increases during the first and second etching processes, the rough of the inner side surface within the contact hole is improved. As such, it is preferable for the time for performing the second etching to be the same as or shorter than the time for performing the first etching.

As shown in FIG. 15B, first and second inclined surfaces S1 and S2 of the contact hole for the gate pad 210 are formed in a smooth surface. As such, the step-coverage is not generated among the organic insulation film 600, the protective film 500, and the gate insulation film 200.

In addition, although the metal film 470 is formed on the lower substrate 100 as shown in FIG. 15C, a disconnection is not generated in the metal film 470 within the contact hole for the gate pad 210.

In this way, the third mask process of the present embodiment performs the etching process twice. As a result, the step-coverage on the inner side surface of the contact hole is eliminated.

Figure 16:
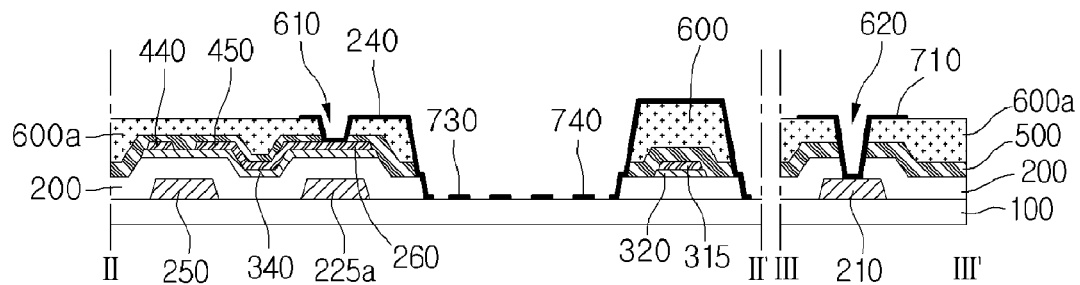
FIGS. 16 to 18 are cross-sectional views which show a thin film transistor array substrate taken along lines II-II' and III-III' in FIG. 3 and explain methods of fabricating LCD devices according to second through fourth embodiments of the present invention.
Figure 17:
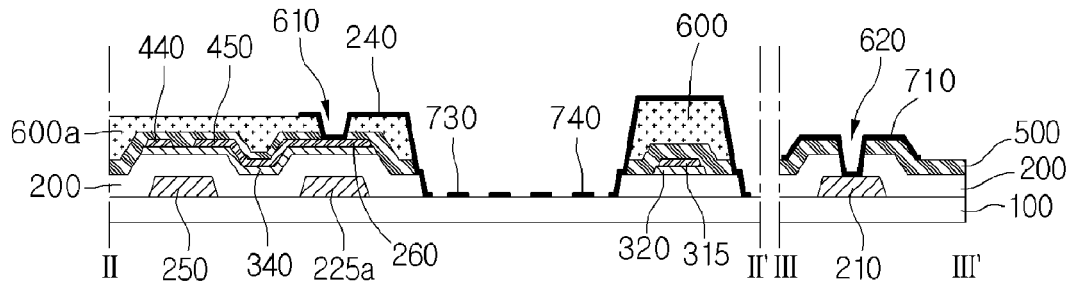
Figure 18:
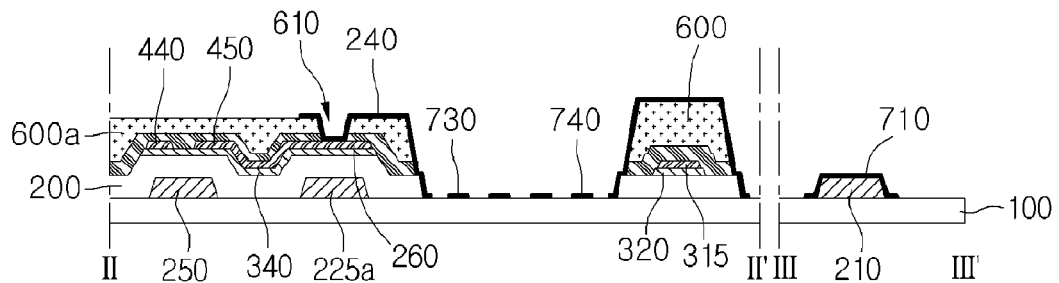

FIGS. 16 to 18 are cross-sectional views which show a thin film transistor array substrate taken along lines II-II' and III-III' in FIG. 3 and explain methods of fabricating LCD devices according to the second to fourth embodiments of the present invention.

The methods of fabricating the second to fourth embodiments may be performed in the same way as that of the first embodiment which is illustrated in FIGS. 4A to 8B, even though the thin film transistor array substrate which is fabricated by the methods of the second to fourth embodiments has a structure partially different from the one which is fabricated by the method of the first embodiment. Therefore, the methods of the second to fourth embodiment will now be described with respect to the portions distinguished from the structure shown in FIG. 4A to FIG. 8B. Also, the methods of the second to fourth embodiments will refer to the same reference numbers for the same elements as those shown in FIG. 4A to FIG. 8B.

The methods of the second to fourth embodiments allow the structure in the non-display area, on which the data pad and the gate pad are formed according to the method of the first embodiment, to be modified.

As shown in FIGS. 3 and 16, the method of the second embodiment allows an organic insulation pattern 600a formed in a region, which is covered with the gate pad 210, to have a different thickness from the organic insulation film 600 formed above the data line 315.

More specifically, the method of the second embodiment allows the organic insulation film pattern 600a in the region of the thin film transistor and the organic insulation film pattern 600a in the region of the gate pad 210 to be formed in the same thickness. Although it is not shown in the drawing, the organic insulation film pattern is also formed in the region of the data pad in the same manner as those of the regions of the gate pad 210 and thin film transistor. In other words, the organic insulation film pattern 600a in the non-display area, which is covered with the data pad and the gate pad 210, has a smaller thickness than the organic insulation film 600 which overlaps the data line 315. The organic insulation film pattern 600a with the smaller thickness may be implemented by the third mask process in which one of the half tone mask and the diffractive mask is used to form the contact holes.

In this way, the lowered height of the organic insulation film pattern 600a in the pad regions results from the fact that the organic insulation film 600 is thicker than the protective film 500 and the gate insulation film 200. If the organic insulation film pattern 600a is formed with a uniform height in both of the display and non-display areas, contact defects with terminals of an external driver integrated-circuit are generated.

Therefore, the LCD device with lowered organic insulation film in the pad regions makes an easy electrical contact with the terminals of an external driver integrated-circuit.

The method of the third embodiment achieves a thin film transistor array substrate of a structure in which the organic insulation film pattern 600a is completely removed from the gate pad region and data pad region, as shown in FIG. 17. As such, a gate pad contact electrode 710 is electrically connected to the gate pad 210 while it is formed on the protective film 500. Similarly, a data pad contact electrode (not shown) is electrically connected to the data pad (not shown) when it is formed on the protective film 500.

The method of the fourth embodiment achieves a thin film transistor array substrate of a structure in which the organic insulation film pattern 600a, the protective film 500, and the gate insulation film 200 are completely removed from the gate pad region. Similarly, the organic insulation film pattern 600a and the protective film 500 are completely removed from the data pad region. In this case, the gate insulation film 200 under the data pad remains. Moreover, all of the organic insulation film pattern 600a, the protective film 500, and the gate insulation film 200 between the gate pads and between the data pads are removed so that the surface of the lower substrate 100 is exposed between the data pads and between the gate pads.

Consequently, the gate pad contact electrode 710 is directly formed on the gate pad 210 and the lower substrate 100. Also, the gate pad contact electrode 710 completely covers the gate pad 210.

In these ways, the methods according to the embodiments may form a variety of structures in the pad regions of the LCD device without an additional mask process.

It will be apparent to those skilled in the art that various modifications and variations can be made in the thin film transistor array substrate and method for fabricating the same of the present invention without departing from the spirit or scope of the invention. Thus, it is intended that the present invention cover the modifications and variations of this invention provided they come within the scope of the appended claims and their equivalents.

What is claimed is:

1. A thin film transistor array substrate comprising:
    a substrate;
    a gate line intersecting a data line to define a pixel region on the substrate;
    a switching element disposed at an intersection of the gate line and the data line;
    a plurality of second pixel electrodes and a plurality of first common electrodes alternately arranged in the pixel region;
    a second common electrode disposed on an organic insulation film, wherein the second common electrode is overlapped with the data line, wherein the data line is interposed between a gate insulation film and a protective film;
    a first storage electrode on the substrate;
    a second storage electrode overlapping the first storage electrode; and
    a first pixel electrode connected to the second storage electrode through a contact hole,
    wherein the organic insulation film is formed on the switching element, the second storage electrode, the data line, a gate pad, and a data pad, and
    wherein the second common electrode covers the data line, the protective film, the organic insulation film, and the gate insulation film disposed under the data line, and has inclined surfaces connected to the surface of the substrate, and
    wherein a thickness of the organic insulation film formed over the switching element, the second storage electrode, the gate pad, and the data pad is smaller than that of the organic insulation film formed over the data line.

2. The thin film transistor array substrate according to claim 1, wherein the second storage electrode overlapping the first storage electrode is formed in a single body with a drain electrode of the switching element.

3. The thin film transistor array substrate according to claim 1, wherein the second common electrode is formed from an opaque metal.

4. The thin film transistor array substrate according to claim 1, wherein the plurality of first common electrodes, the plurality of second pixel electrodes, and the second common electrode are formed from a transparent conductive material.

5. The thin film transistor array substrate according to claim 1, wherein a thickness of the organic insulation film which is interposed between the data line and the second common electrode is formed in a range of about 2.5~3.5 μm when a driving frequency of the thin film transistor array substrate is 120 Hz.

6. The thin film transistor array substrate according to claim 1, wherein a thickness of the organic insulation film which is interposed between the data line and the second common electrode is formed in a range of about 5.5~6.5 μm when a driving frequency of the thin film transistor array substrate is 240 Hz.

7. The thin film transistor array substrate according to claim 1, further comprising a path for a liquid crystal material formed in a region which overlaps a part of the data line and configured to allow the liquid crystal material filled in the pixel region to flow between the adjacent pixel regions.

8. The thin film transistor array substrate according to claim 7, wherein the path for the liquid crystal material is formed by removing a part of the organic insulation film which overlaps the data line.

9. A method of fabricating a thin film transistor array substrate, comprising the steps of:
providing a substrate;
forming a gate line intersecting a data line to define a pixel region on the substrate;
forming a switching element disposed at an intersection of the gate line and the data line;
forming a plurality of pixel electrodes and a plurality of first common electrodes alternately arranged in the pixel region and;
forming a second common electrode overlapped with the data line, wherein the data line is interposed between a gate insulation film and a protective film;
forming a first storage electrode on the substrate;
forming a second storage electrode overlapping the first storage electrode; and
forming an organic insulation film on the switching element, the second storage electrode, the data line, a gate pad, and a data pad,
wherein the second common electrode covers the data line, the protective film, the organic insulation film, and the gate insulation film, and has inclined surfaces connected to the surface of the substrate, and
wherein a thickness of the organic insulation film formed over the switching element, the second storage electrode, the gate pad, and the data pad is smaller than that of the organic insulation film formed over the data line.

10. The method of fabricating a thin film transistor array substrate according to claim 9, wherein the second storage electrode overlapping the first storage electrode is formed in a single body with a drain electrode of the switching element.

11. The method of fabricating a thin film transistor array substrate according to claim 9, wherein the second common electrode is formed from an opaque metal.

12. The method of fabricating a thin film transistor array substrate according to claim 9, wherein the plurality of first common electrodes, the plurality of pixel electrodes, and the second common electrode are formed from a transparent conductive material.

13. The method of fabricating a thin film transistor array substrate according to claim 9, wherein a thickness of the organic insulation film which is interposed between the data line and the second common electrode is formed in a range of about 2.5~3.5 μm when a driving frequency of the thin film transistor array substrate is 120 Hz.

14. The method of fabricating a thin film transistor array substrate according to claim 9, wherein a thickness of the organic insulation film which is interposed between the data line and the second common electrode is formed in a range of about 5.5~6.5 μm when a driving frequency of the thin film transistor array substrate is 240 Hz.

15. The method of fabricating a thin film transistor array substrate according to claim 9, wherein a path for a liquid crystal material is formed in a region which overlaps a part of the data line and configured to allow the liquid crystal material filled in the pixel region to flow between the adjacent pixel regions.

16. The method of fabricating a thin film transistor array substrate according to claim 15, wherein the path for the liquid crystal material is formed by removing a part of the organic insulation film which overlaps the data line.

17. A method of fabricating a thin film transistor array substrate, comprising the steps of:
providing a substrate;
forming a first metal film on the substrate;
patterning the first metal film into a gate electrode, a gate line, a first storage electrode and a gate pad through a first mask process;
sequentially forming a gate insulation film, a semiconductor layer, and a second metal film on the substrate;
forming a plurality of source electrodes, a plurality of drain electrodes, a second storage electrode, a channel layer, and a data line formed from the second metal film and the semiconductor layer through a second mask process;
sequentially forming a protective film and an organic insulation film on the substrate;
patterning the organic insulation film to expose a part of the protective film through a third mask process;
sequentially performing first and second etching steps in which the patterned organic insulation film is used as an etch mask by using etching gases with different oxygen content ratios, in order to form a pixel region on the substrate, a first contact hole exposing the second storage electrode and a second contact hole exposing the gate pad;
forming a third metal film on the substrate; and
patterning the third metal film in the pixel region into a pixel electrode, a first common electrode and a second common electrode, and
wherein the second common electrode covers the data line, the protective film, the organic insulation film, and the gate insulation film disposed under the data line, and has inclined surfaces connected to the surface of the substrate, and
wherein the third mask process removes at least a part of the organic insulation overlapping the data line, and forms a path for a liquid crystal material allowing a liquid crystal to flow between adjacent pixel regions.

18. The method of fabricating a thin film transistor array substrate according to claim 17, wherein the third mask process uses one of a half tone mask and a diffraction mask and enables the organic insulation film over the source/drain electrodes and the second storage electrode to have a smaller thickness than that of the organic insulation film over the data line.

19. The method of fabricating a thin film transistor array substrate according to claim 17, wherein the etching gas used the first etching step includes SF6:O2 with a flow ratio in a range of about 1:2.0-1:3.0.

20. The method of fabricating a thin film transistor array substrate according to claim 17, wherein the etching gas used the second etching step includes SF6:O2 with a flow ratio in a range of about 1:2.4-1:3.0.

21. The method of fabricating a thin film transistor array substrate according to claim 17, wherein the inner side surfaces of the first contact hole and the second contact hole formed by the third mask process are smoothed.

* * * * *